(12) United States Patent
Deng et al.

(10) Patent No.: US 7,164,596 B1
(45) Date of Patent: Jan. 16, 2007

(54) SRAM CELL WITH COLUMN SELECT LINE

(75) Inventors: Xiaowei Deng, Plano, TX (US);
Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/191,741

(22) Filed: Jul. 28, 2005

(51) Int. Cl.
*G11C 11/00* (2006.01)
*G11C 7/00* (2006.01)
(52) U.S. Cl. .................. 365/154; 365/226; 365/189.01
(58) Field of Classification Search ................ 365/154, 365/226, 230.06, 189.01
See application file for complete search history.

(56) References Cited

U.S. PATENT DOCUMENTS

| | | | |
|---|---|---|---|
| 5,255,230 A * | 10/1993 | Chan et al. ................. | 365/201 |
| 5,353,251 A | 10/1994 | Uratani et al. | |
| 5,469,380 A | 11/1995 | Iio | |
| 5,475,638 A | 12/1995 | Anami et al. | |
| 5,828,597 A | 10/1998 | Madan | |
| 5,831,897 A | 11/1998 | Hodges | |
| 6,091,626 A | 7/2000 | Madan | |
| 6,549,453 B1 * | 4/2003 | Wong ........................ | 365/156 |
| 6,741,500 B1 * | 5/2004 | DeShazo et al. ....... | 365/185.28 |
| 6,831,871 B1 | 12/2004 | Khellah et al. | |

OTHER PUBLICATIONS

U.S. Appl. No. 11/191,348, filed Jul. 28, 2005, Redwine.

* cited by examiner

*Primary Examiner*—Son T. Dinh
(74) *Attorney, Agent, or Firm*—Jacqueline J. Garner; W. James Brady, III; Frederick J. Telecky, Jr.

(57) ABSTRACT

An array of SRAM cells (e.g., 6T single-ended or 8T differential cells) and method is discussed having variable high and low voltage power supplies to provide to selected cells of the array a write bias condition during a write operation and a read bias condition to the array during a read operation, wherein the read bias condition is different from the write bias condition.

26 Claims, 11 Drawing Sheets

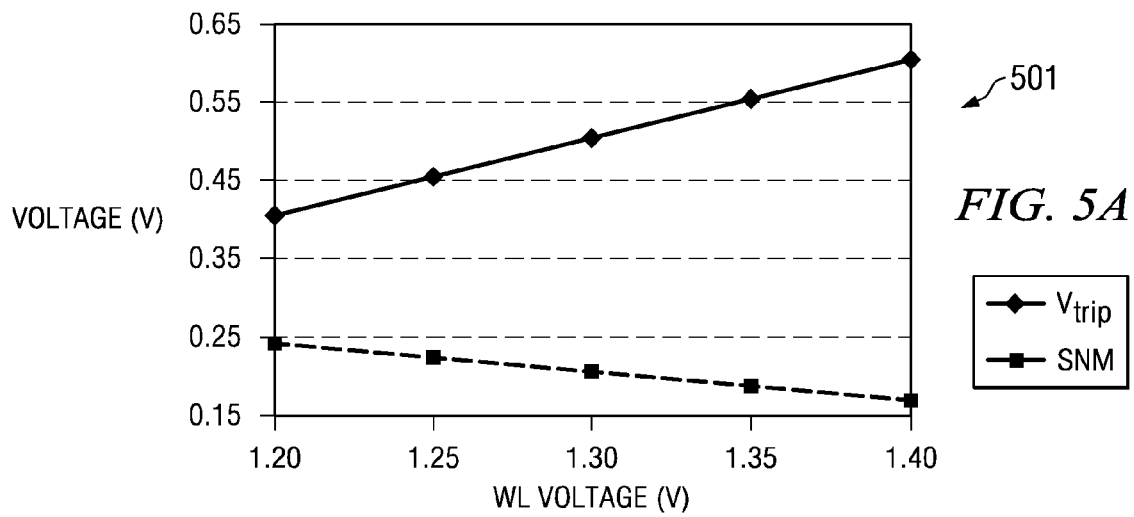
*FIG. 5A*
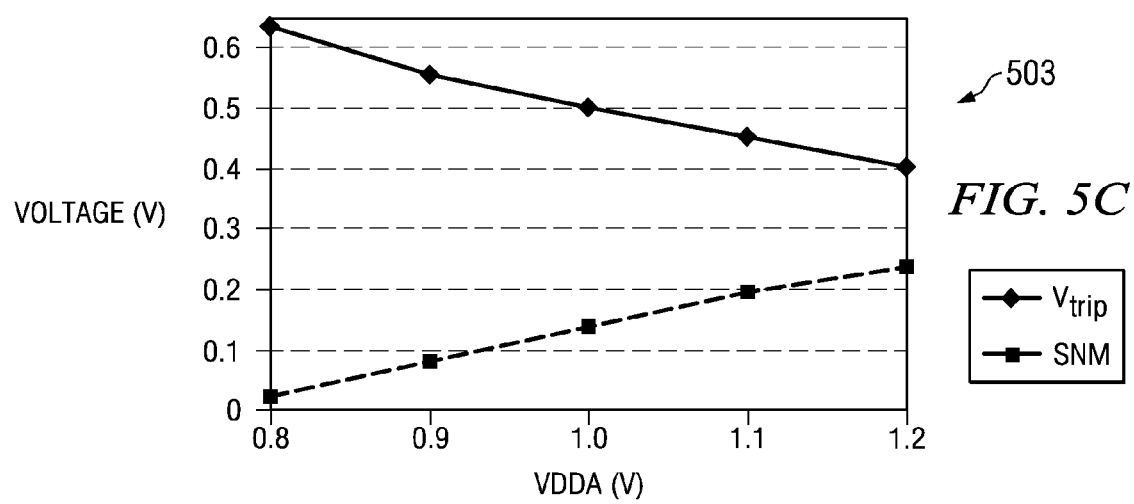
*FIG. 5B*
*FIG. 5C*

US 7,164,596 B1

SRAM CELL WITH COLUMN SELECT LINE

FIELD OF INVENTION

The present invention relates generally to semiconductor memory devices and more particularly to an improved SRAM array structure and method of operating an SRAM array to improve the static noise margin, and to minimize power dissipation and the risk of destabilizing unaddressed cells of the accessed wordline during write operations in the manufacture of semiconductor products.

BACKGROUND OF THE INVENTION

Current trends in the semiconductor and electronics industry require memory devices to be made smaller, faster and require less power consumption. One reason for these trends is that more personal devices are being manufactured that are relatively small and portable, thereby relying on battery power. In addition to being smaller and more portable, personal devices are also requiring increased memory and more computational power and speed. In light of all these trends, there is an ever increasing demand in the industry for smaller, faster, and lower power dissipation memory cells and transistors used to provide the core functionality of these memory devices.

Semiconductor memories can, for example, be characterized as volatile random access memories (RAMs) or non-volatile read only memories (ROMs), where RAMs can either be static (SRAM) or dynamic (DRAM) differing mainly in the manner by which they store a state of a bit. In SRAM, for example, each memory cell includes transistor-based circuitry that implements a bistable latch, which relies on transistor gain and positive (e.g., reinforcing) feedback so that it can only assume one of two possible states, namely on (state 1) or off (state 2). The latch can only be programmed or induced to change from one state to the other through the application of a voltage or other external stimuli. This arrangement is desirable for a memory cell since a state written to the cell will be retained until the cell is reprogrammed.

DRAMs on the other hand implement a capacitor that is either charged or discharged to store the on (state 1) or off (state 2) state of a cell. Capacitors discharge over time, however, and DRAMs must therefore be periodically 'refreshed'. Also, a bistable latch can generally be switched between states much faster than the amount of time it takes to charge or discharge a capacitor. Accordingly, SRAMs are a desirable type of memory for certain types of applications.

SRAM is typically arranged as a matrix of memory cells fabricated in an integrated circuit chip, and address decoding in the chip allows access to each cell for read/write functions. SRAM memory cells use active feedback from cross-coupled inverters in the form of a latch to store or "latch" a bit of information. These SRAM memory cells are often arranged in rows so that blocks of data such as words or bytes can be written or read simultaneously. Standard SRAM memory cells have many variations.

The basic CMOS SRAM cell generally includes two n-type or n-channel (nMOS) pull-down or drive transistors and two p-type (pMOS) pull-up or load transistors in a cross-coupled inverter configuration, with two additional nMOS select or pass-gate transistors added to make up a standard double-sided or differential six-transistor memory cell (a DS 6T SRAM cell, a 6T SRAM cell, or simply a 6T cell). Additionally, application specific SRAM cells can include an even greater number of transistors. A plurality of transistors are utilized in SRAM requiring matched electrical characteristics to provide predictable cell switching characteristics, reliable circuit performance, and minimize array power dissipation.

As transistor scaling trends continue, however, it becomes increasingly difficult to design an SRAM cell that has both adequate static noise margin (SNM), adequate trip voltage (Vtrip), and also can endure read and write operations over the desired operating range of temperature, bias conditions, and process variations. The trip voltage (Vtrip) is essentially a measure of the ability of a cell to be written into, and there is an interdependency between SNM and Vtrip in SRAM cell design. For example, if the pass gate is too strong relative to the drive transistor, SNM is degraded. If the pass gate is too weak relative to the drive transistor, Vtrip is degraded. Also, if the load is too weak relative to the drive transistor, SNM is degraded. Single-sided 4T and 5T SRAM cells (e.g., SS 5T SRAM cells) have also been proposed, but these cells generally suffer from much of the above mentioned compromises including poor data stability, low noise margins, and many other such difficult issues.

Generally, therefore, whatever improves SNM, also degrades Vtrip, and vice versa. With technology scaling to the 45 nm node and beyond, it may no longer be possible to achieve a balance in the relative strengths of the pass gate, drive, and load transistors over the desired range of temperature and bias conditions as well as process variations.

In a standard memory array configuration, only a subset of the cells are addressed in an accessed row. During write operations of a standard differential 6T cell, for example, bias conditions must be such that the unaddressed cells in the accessed row are not subject to upset. Therefore, it may be desirable to lower the array Vdd to reduce power dissipation, but low Vdd reduces the stability of the standard 6T SRAM cells. Similarly, it may be desirable to raise the wordline voltage to improve the SNM margin during write operations; however, the higher wordline voltage may also reduce the stability of the unaddressed cells.

Thus, the current balance in cell design values often involves a trade-off that may translate to a higher incidence of data upsets and/or slower access times during cell read and write operations. In addition, although a relatively small subset of the cells may be addressed at any one time in the standard memory configuration, power is consumed on all cells of the array.

Accordingly, there is a need for an improved SRAM array structure and method of operating the SRAM array in a manner that provides optimum static noise margin, while minimizing data upsets and power dissipation during read and write operations in the fabrication of SRAM memory devices.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later. The invention relates to an array structure of SRAM cells (e.g., 6T single ended or 8T differential cells) and method is discussed having variable high and low voltage power supplies to provide to selected columns of the array (or the entire array) a write bias condition during a write operation and a read bias condition during a read operation, wherein the read bias condition is different from the write bias condition. Optimum static noise margin is provided while minimizing data upsets and power dissipation during read and write operations, by allowing the array supply voltage to be kept low during all but the read operation and then, enabled by a column select, only raising the supply to the selected columns for increased read current. In addition, by avoiding boosting the array supply and wordline voltages during write operations, the present invention also minimizes dielectric reliability issues.

In one implementation of the present invention, the array structure comprises a plurality of SRAM cells arranged in rows and columns with a plurality of bit lines and column select lines running in the column direction and word lines running in the row direction. The cells comprising first and second cross-coupled inverters having first and second outputs, respectively, a first pair of pass gates comprising a first column select pass gate connected to one of the column select lines for selecting a column of cells, and a first row select pass gate connected to a first one of the word lines for selecting a row of cells, the first pair of pass gates connected in series between the first output of the first inverter and a first of the plurality of bit lines. The array also has a high voltage supply operable to provide a variable high voltage (e.g., VDDA) to the cross-coupled inverters; and a low voltage supply operable to provide a variable low voltage (e.g., VSSA) to the cross-coupled inverters. The high and low voltage supplies are operable to supply a write bias condition to the selected cells of the array (or the entire array) during a write operation and a read bias condition to the selected cells of the array (or the entire array) during a read operation, and wherein the write bias condition is different from the read bias condition.

A word line driver operable to drive the wordline, and a column select line driver operable to drive the column select line, are also described for use either separately, or in association with the variable high and low voltage supplies of the present invention. The word line driver, the column select line driver, and the high and low voltage supplies are operable to supply a write bias condition to the array during a write operation and a read bias condition to the array during a read operation, wherein the write bias condition is different from the read bias condition. This additional aspect provides a wider range of write bias or read bias conditions to enable a single-sided write operation that permits a smaller cell compared to that of a double-sided write operation and cell. The methods and structure described herein are applicable to silicon wafer fabrication and other such fabrication processes in the manufacture of semiconductor memory devices.

In another aspect of the invention, the word line driver is operable to drive the word line to a higher voltage during the write operation than during the read operation.

In still another aspect, the column select line driver is operable to drive the column select line to a higher voltage during the write operation than during the read operation.

In yet another aspect of the invention, the voltage supplied by the high voltage supply is higher during the read operation than during the write operation.

In another aspect of the invention, the high voltage provided by the high voltage supply is raised during the read operation.

In still another aspect of the invention, the high voltage provided by the high voltage supply is raised in selected columns of cells during the read operation.

In yet another aspect of the invention, the voltage supplied by the low voltage supply is higher during the write operation than during the read operation.

In another aspect of the invention, the low voltage provided by the low voltage supply is raised during the write operation.

In still another aspect of the invention, the low voltage provided by the low voltage supply is lowered during the read operation.

In yet another aspect of the invention, the low voltage provided by the low voltage supply is lowered in selected columns during the read operation.

In another aspect of the invention, the low voltage provided by the low voltage supply is raised during the write operation.

In still another aspect of the invention, the high voltage provided by the high voltage supply is raised in selected columns of cells, and the low voltage provided by the low voltage supply is lowered in selected columns of cells during the read operation.

In yet another aspect of the invention, the high voltage provided by the high voltage supply is lowered in selected columns of cells, and the low voltage provided by the low voltage supply is raised in selected columns of cells during the write operation.

In another aspect, the plurality of memory cells further comprises a second pair of pass gates comprising a second row and column select pass gates connected in series between the second output of the second inverter and a second of the plurality of bit lines, the second pair of pass gates comprising a second column select pass gate connected to one of the column select lines for selecting a column of cells, and a second row select pass gate connected to the first one of the word lines for selecting a row of cells, the second pair of pass gates connected in series between the second output of the second inverter and a second of the plurality of bit lines.

In still another aspect of the invention, a method of operating an SRAM memory cell of an array having one of the array structures described above, and comprises establishing a read bias condition during a read operation by raising the voltage of the high voltage supply and lowering the voltage of the low voltage supply to the selected columns of cells. The method also comprises establishing a write bias condition during a write operation by lowering the voltage of the high voltage supply to the selected columns of cells, and raising the voltage of the low voltage supply to the selected columns of cells. The method further comprises accessing a word line of the SRAM memory cell by asserting a word line signal to the row select line associated with the memory cell during the read or the write operation, and accessing a column select line of the SRAM memory cell by asserting a column select signal to the column select line associated with the memory cell during the read or the write operation such that one of the plurality of cells of the array is accessed.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

BRIEF DESCRIPTION OF THE DRAWINGS

FIG. 5A is a graph of the impacts of a word line voltage (VWL) on trip voltage (Vtrip) and static noise margin (SNM) in a conventional differential 6T SRAM cell similar to that of FIG. 1A;

FIGS. 5B and 5C are graphs of the impact of VssA and VddA array supply voltages on trip voltage (Vtrip) and static noise margin (SNM) in a conventional differential 6T SRAM cell similar to that of FIG. 1A;

DETAILED DESCRIPTION OF THE INVENTION

Figure 1A:
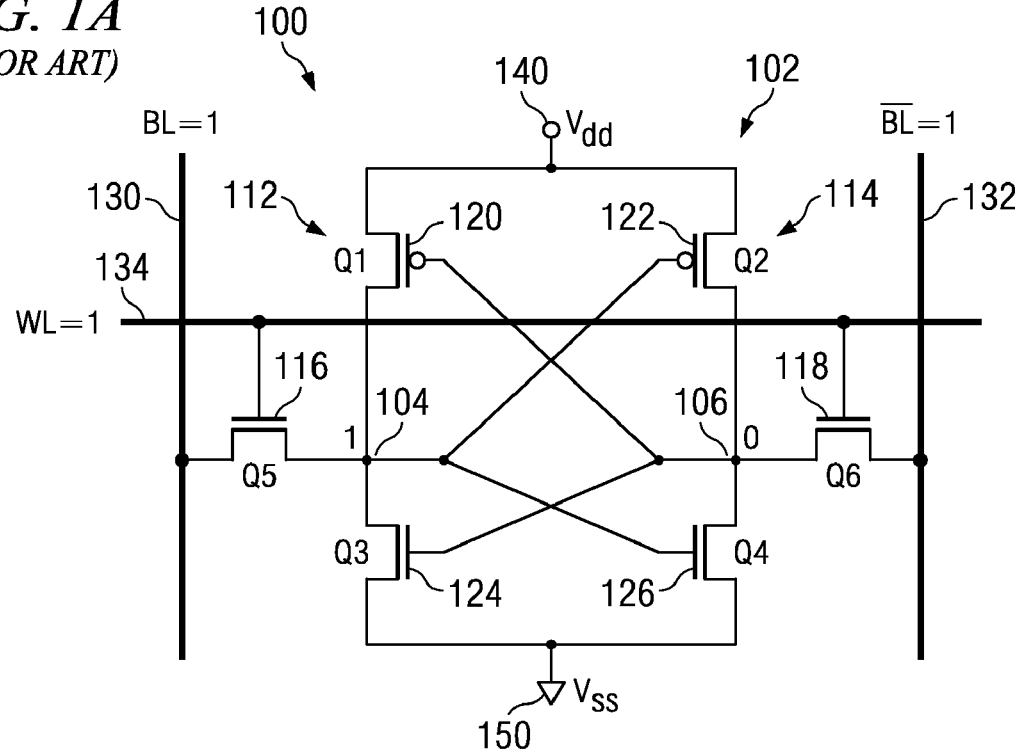
FIG. 1A is a schematic diagram of a conventional differential 6T static random access memory (SRAM) cell.

The present invention will now be described with reference to the attached drawings, wherein like reference numerals are used to refer to like elements throughout. The invention provides an improved SRAM array structure comprising SRAM cells (e.g., single sided 6T or differential 8T cells) having variable high and low voltage power supplies and a method of operating the SRAM array that provides a write bias condition during a write operation and a read bias condition during a read operation, wherein the read bias condition is different from the write bias condition.

The system and method provides optimum static noise margin while minimizing data upsets and power dissipation during read and write operations, by allowing the array supply voltage to be kept low during all but the read operation and then, enabled by a column select, only raising the supply to the selected columns to provide increased read current. In addition, by avoiding boosting the array supply and wordline voltages during write operations, the present invention also minimizes dielectric reliability issues. Further, the above mentioned SRAM cell and write operation enhancements enable a single-sided write operation, permitting a smaller SRAM cell (e.g., a SS 6T SRAM cell) compared to that of a differential (double-sided) write operation. However, the system and method of the present invention is not limited to the single-sided SRAM cell, but is also applicable to differential SRAM cells or other such single-sided and differential memory cells and cell technologies are anticipated in the context of the invention.

Because of transistor scaling trends, however, it becomes increasingly important to design a compact and low power SRAM cell that has adequate static noise margin (SNM), and can endure write operations over the desired operating range of temperature, bias conditions, and process variations without producing data upsets.

The inventors of the present invention have appreciated that increasing the voltage on the wordline (WL) (e.g., a boosted wordline) would improve the SNM, but may then subject the unaddressed cells in the accessed row to a higher risk of data upset. The inventors of the present invention have also appreciated that the risk of data upset is greatly diminished by reducing the power supply voltage to the array or the selected cell(s) of the array during the write operation. Accordingly, the inventors appreciate that a lowered write bias condition may be preferable during a write operation, and would further reduce the overall power requirements by having this lowered bias condition remain as long as possible. During a write operation, the selected cell is coupled by one or more pass gates to an associated bitline pair, for example, that have been both precharged to high states. The bitlines then receive charge from the selected cell based on the state voltages on the cell, wherein one of the bitlines of the bitline pair is pulled up and another of the pair is pulled down.

The inventors of the present invention have also appreciated that it is desirable to have an increased read current (an improved read bias condition), and that the read current may be increased by increasing the supply voltage to the array (e.g., VDDA and VSSA), or preferably to the selected cell(s) of the array during the read operation. For example, this increased read bias condition may be accomplished by raising the voltage on the Vdd terminal, and/or lowering the voltage on the Vss terminal of the selected cell(s) of the array. Limiting the read bias condition to the selected cell(s) requires the least power consumption; however, the read bias may also be applied to the column of cells associated with the selected cell or to an associated segment of the array.

Accordingly, one implementation of the method of the present invention comprises establishing a read bias condition during a read operation by raising the high voltage supply voltage and/or by lowering the low voltage supply voltage to the selected columns of cells. The method further comprises establishing a write bias condition during a write operation by lowering the high voltage supply voltage and/or by raising the low voltage supply voltage to the selected columns of cells. Then, the present invention further comprises accessing the selected cell by raising the word line (WL) and the column select line (CSL) of the SRAM memory cell by asserting a wordline and a column select line signal to the WL and the CSL, respectively, during a read or write operation. As a result, the static noise margin SNM of the SRAM cell may be improved, while the risk of upsetting the unselected cells along a wordline (data upsets) is minimized. In addition, this arrangement may be useful to limit power dissipation in the array to the selected cell or cells that are accessed.

Exemplary implementations are hereinafter illustrated and described in the context of fabricating SRAM cell circuits and methods to improve the SNM of an SRAM cell, particularly in highly scaled memory arrays, and to avoid write data upsets, wherein the structures illustrated are not necessarily drawn to scale. Although a single-sided 6T SRAM cell accessed from a single bitline, and a differential 8T SRAM cell accessed from a pair of bitlines is discussed and illustrated in the context of the present invention, other such cells may also utilize the methods and circuits illustrated herein, and these cells are contemplated. Further, it will be appreciated that the invention may be employed in the fabrication of SRAM memory devices, silicon wafer fabrication and other such fabrication processes in the manufacture of semiconductor memory devices and other such processes apart from the exemplary memory structures described and illustrated herein. These and other benefits will become more apparent as the following figures are described infra.

Beginning at FIG. 1A a conventional differential SRAM cell 100 is illustrated comprising a differential 6T static random access memory (SRAM) cell 100. As illustrated, the SRAM cell 100 comprise a data storage cell or latch 102, generally including a pair of cross-coupled inverters, for example, inverter 112, and inverter 114, the latch 102 operable to store a data bit state. FIG. 1A illustrates that the bit is stored in the latch 102 at the data nodes or first and second latch nodes 104 and 106, respectively, having a high or "1" state and a low or "0" state, respectively. Cell 100 of FIG. 1A also comprises a pair of wordline pass transistors 116, 118 to read and write the data bit between the cross-coupled inverters 112, 114 and bitlines BL 130, BL-bar 132, when enabled by wordline 134.

Respective inverters 112, 114 comprise a p-type MOS (pMOS) pull-up or load transistor Q1 120, Q2 122 and an n-type (nMOS) pull-down transistor Q3 124, Q4 126. Pass gates (e.g., transistors) Q5 116, Q6 118 are n-channel as well, which generally supply higher conductance than p-channel transistors. Pass transistors 116, 118 are enabled by wordline 134 and accessed by bitlines 130, 132 to set or reset the SRAM latch 100. FIG. 1A further illustrates that inverters 112, 114 of the SRAM memory cell 100 are connected together to a Vdd drain power supply line 140 and a Vss source power supply line 150.

The differential 6T SRAM cell comprises six transistors and is termed a 6T full CMOS SRAM cell. When the channels of all the transistors are formed in the single crystal silicon substrate, it is called a single crystalline bulk CMOS 6T SRAM cell. It is also referred to as a planar SRAM cell when all the transistors are made in the same substrate material (e.g., bulk crystalline silicon, SOI, etc.).

In general, SRAM cells are more stable and have better data retention where the respective pMOS (120, 122) and nMOS (124, 126) transistors are balanced and matched within the two inverters (112, 114). However, as dimensions are reduced to scale down devices, it becomes increasingly difficult to achieve a balance in the relative strengths of the pass gate, drive, and load transistors over the desired range of temperature, bias conditions, and process variations, as well as achieving matched transistor characteristics. As a result, SRAM cells formed as such can be adversely affected by varying operating characteristics and may be unstable and may not retain the desired bit state, during read or write operations.

During conventional read or write operations, bitlines 130 and 132 are initially precharged to a high or "1" state as illustrated. A read voltage is asserted to wordline WL 134 during a read or a write operation to activate pass transistors Q5 116 and Q6 118 into conduction, whereby latch 102 may be accessed by bitlines 130 and 132, respectively. With the prior data states as shown in FIG. 1, an exemplary high state "1" is on a first latch node 104 at the gate of Q4 126, and a low state "0" is on a second latch node 106 at the gate of Q3 124. With these data states, only Q4 126 on the "low side" conducts via latch node 106, and pulls bitline-bar 132 lower, while Q3 124 on the "high side" does not conduct and thus, leaves bitline 130 high. Thus, given a finite amount of time, the cell will increasingly establish a greater differential voltage between the bitlines 130 and 132.

Figure 1B:
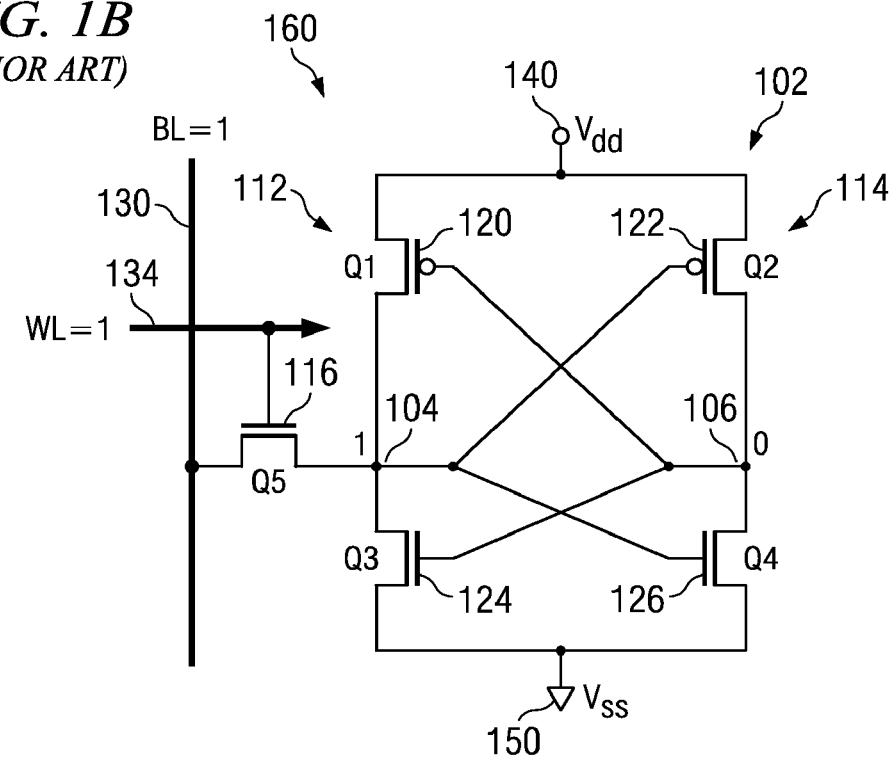
FIG. 1B is a schematic diagram of a conventional single-sided 5T SRAM cell.

Similarily, FIG. 1B illustrates a conventional single-sided SRAM cell 160 comprising a single-sided 5T static random access memory (SRAM) cell 160. As illustrated, the SRAM cell 160 also comprises a data storage cell or latch 102, generally including a pair of cross-coupled inverters, for example, inverter 112, and inverter 114, the latch 102 operable to store a data bit state. In addition, cell 160 of FIG. 1B further comprises a single wordline pass gate (e.g., transistor) 116 to read and write the data bit between the cross-coupled inverters 112, 114 and a single bitline (e.g., BL 130), when enabled by wordline 134.

Read and write operations in the single-sided cell, are carried out similar to that of the differential SRAM cell 100, except the balance of SNM and Vtrip becomes more difficult. When either a "1" or a "0" is to be written into the differential SRAM cell 100, the dominating operation is pulling one side or the other low. This is because the PMOS pull-up transistors Q1 120 and Q2 122 are weaker than the NMOS pull-down transistors Q3 124 and Q4 126. Once one of node 104 or node 106 is pulled low, the cross-coupling within the cell assists in driving the opposite side high. The cell can be designed such that a high voltage on the bit line will not pull the associated node in the cell high. Thus, precharging the bit lines high will not cause upset of the cell during a read. In contrast, for the write operation with the single-sided cell 160, the single bit line 130 must be able to pull the associated node 104 either high or low. At the same time, there must be a bias condition for the read operation that does not upset the cell.

Figure 2A:
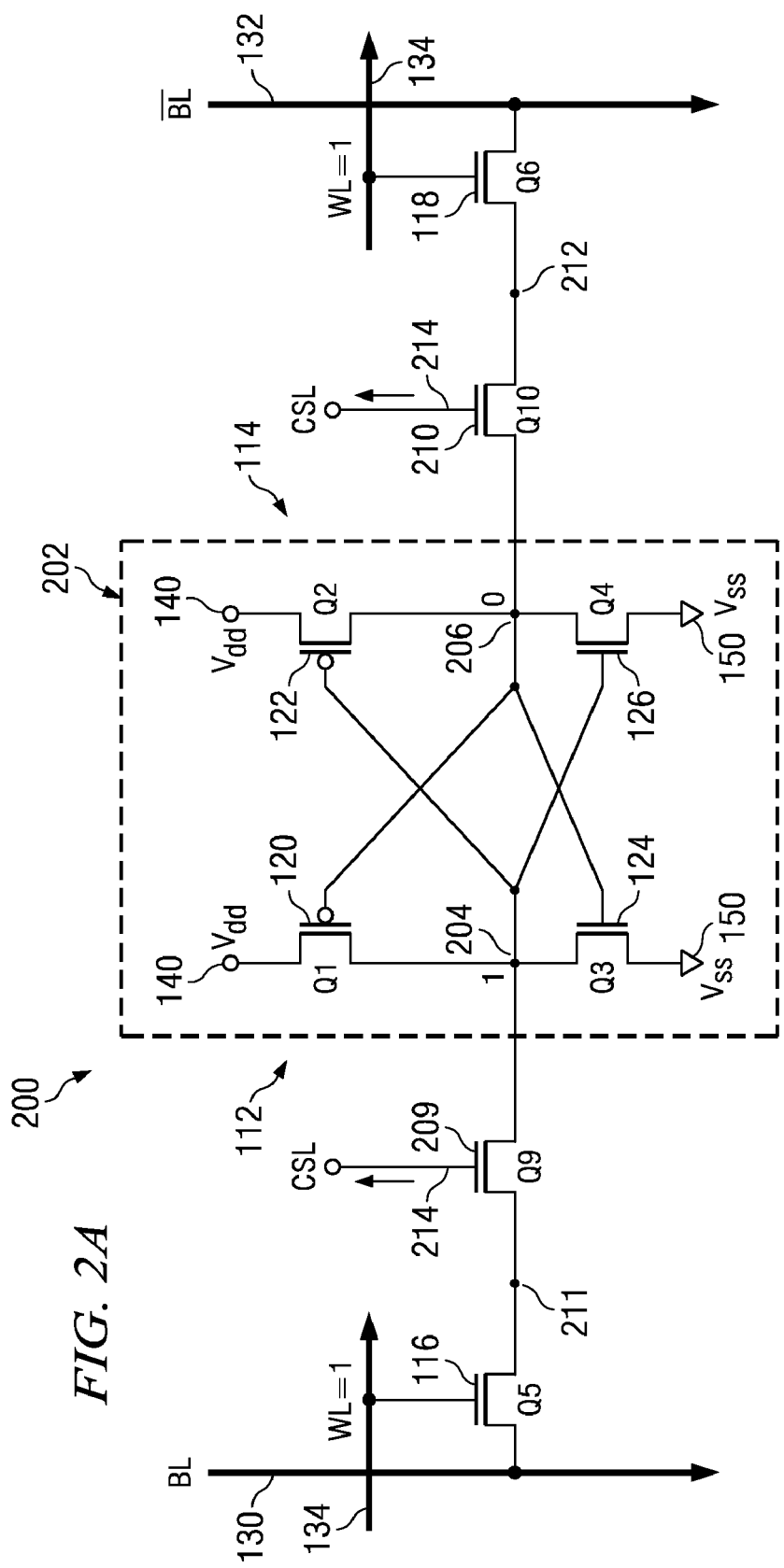
FIGS. 2A and 2B are schematic diagrams of a differential 8T SRAM cell such as may be used in accordance with the present invention.
Figure 2B:
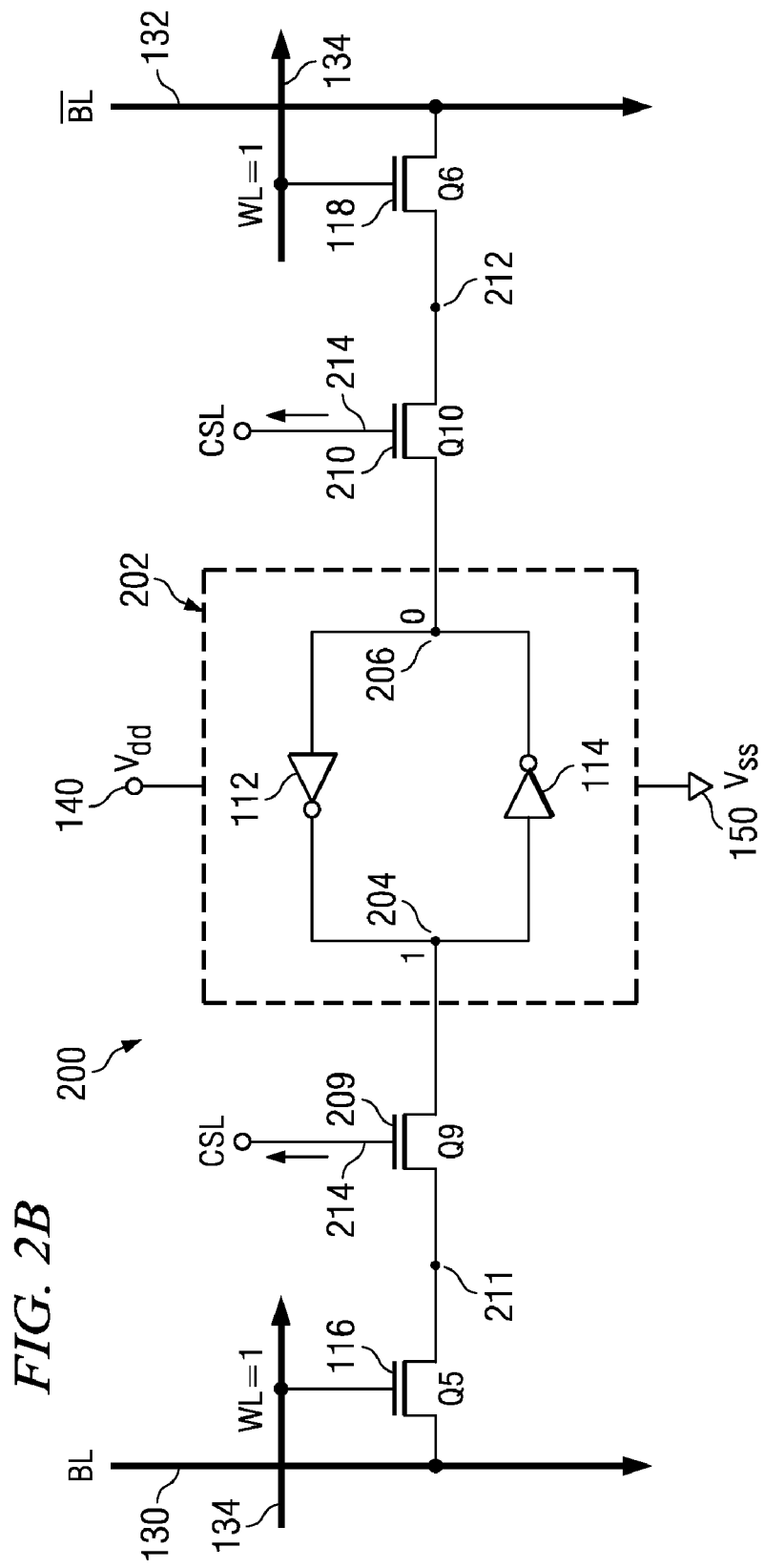

FIGS. 2A and 2B illustrate an exemplary differential 8T SRAM cell 200 such as may be used in accordance with the present invention. Compared to the differential 6T SRAM cell 100 of FIG. 1A, the 8T SRAM cells 200 of FIGS. 2A and 2B comprise additional first and second column select pass gates (e.g., transistors) Q9 209 and Q10 210, respectively, for selecting columns of cells using column select lines CSL 214 during a write operation. Differential 8T SRAM cell 200 again comprises a latch 202 having cross-coupled inverters 112 and 114 with first and second latch nodes 204 and 206, for storing data. The basic latch 202 is similar to latch 102 of cell 100 and as such need not be completely described again for the sake of brevity. The columns of cells are selected during a write operation by coupling first and second latch nodes 204 and 206 to pass nodes 211 and 212 with column write pass gates Q9 209 and Q10 210, respectively, while pass transistors Q5 116 and Q6 118 couple pass nodes 211 and 212 to BL 130 and BL-bar 132, respectively.

During the write operation, a write signal is asserted to wordline 134 and a column select signal is asserted to column select line CSL 214 at the gates of column select pass gates Q9 209 and Q10 210. In this way, the latch nodes 204 and 206 are conductively coupled to the bitlines BL 130 and BL-bar 132, respectively, during a write operation. Beneficially, the column select line CSL 214 together with column select pass gates Q9 209 and Q10 210, limit write operations along a wordline row of cells to the column or columns of cell(s) that are specifically selected, thereby minimizing data upsets to the unselected cells of the accessed word line 134.

In accordance with the present invention, data upsets along the accessed word line 134 may be further minimized by adjusting one or more bias conditions of the cell 200 during the write operation, herein referred to as a write bias condition. For example, the write bias condition comprises the level of the power supply voltages to drain power supply terminals Vdd 140 and source power supply terminals Vss 150 of the selected memory cell 200, as well as the voltage levels of a write signal on word line WL 134 and a column select signal on column select line CSL 214 during a write operation.

In accordance with one aspect of the invention, the write bias condition comprises reducing an array high voltage supply voltage (VDDA) to drain power supply terminals Vdd 140, and/or increasing an array low voltage supply voltage (VSSA) to source power supply terminals Vss 150 of the selected memory cell 200 during a write operation. In this write bias condition, the overall power supply voltage (e.g., the net, or differential supply voltage) is lower in the write bias condition. This write bias condition has the effect of increasing the Vtrip of the cell, because the cell is more easily written into under these bias conditions. As indicated previously, it is preferable that this overall or net power supply voltage level remain low to minimize power dissipation during all operations except for the read operation, which may require a higher voltage for performance.

For improved conduction to the latch 202 during a write operation, the column select signal to column select pass gates Q9 209 and Q10 210, and/or the write signal to wordline pass gates Q5 116 and Q6 118 of the selected cell(s) may be boosted above the Vdd supply voltage level, as will be discussed further in connection with FIGS. 5D–5F, and 5K infra. Thus, the write bias condition on cell 200 may comprise a power supply bias component (VDDA, VSSA) as well as a word line WL 134 and a column select line CSL 214 bias component.

During a read operation, bitlines BL 130 and BL-bar 132 of cell 200, are again precharged to a high or "1" state. A read signal is then asserted onto wordline WL 134 to activate pass gates Q5 116 and Q6 118 into conduction. For example, with the prior data states shown in FIG. 2A, an exemplary read current Iread conducts from the bitline-bar 132 through wordline pass gate Q6 118, pass node 212, column select pass gate Q10 210, and NMOS pull-down transistor Q4 126 to Vss 150.

In accordance with the present invention, read current may be increased by adjusting one or more bias conditions of the cell 200 during the read operation, herein referred to as a read bias condition. The read bias condition comprises, for example, the level of the power supply voltages to drain power supply terminals Vdd 140 and source power supply terminals Vss 150 of the selected memory cell 200, as well as the voltage levels of a write signal on word line WL 134 and a column select signal on column select line CSL 214 during a read operation.

In accordance with one aspect of the invention, the read bias condition comprises increasing the array high voltage supply voltage (VDDA) to drain power supply terminals Vdd 140, and/or decreasing the array low voltage supply voltage (VSSA) to source power supply terminals Vss 150 of the selected memory cell 200 during a read operation. In this read bias condition, the overall power supply voltage (e.g., the net, or differential supply voltage) is greater in the read bias condition than in the write bias condition. This read bias condition has the effect of increasing the read current through the series pass gates and the cell, because the pull-down transistors of the cell conduct more under these bias conditions. The read bias condition also improves the SNM of the cell. However, as indicated previously, it is preferable that the overall or net power supply voltage level remain low to minimize power dissipation during all operations except for the read operation, which may require more conduction.

Again, as with the write operation, for improved read current conduction to the latch 202 during a read operation, the column select signal, and/or the write signal to the selected cell(s) may be boosted above the Vdd supply voltage level, as will be discussed further in connection with FIGS. 5D–5F, and 5K infra. Thus, the read or write bias condition on cell 200 may comprise a power supply bias component (VDDA, VSSA) as well as a word line WL 134 and a column select line CSL 214 bias component.

Figure 3A:
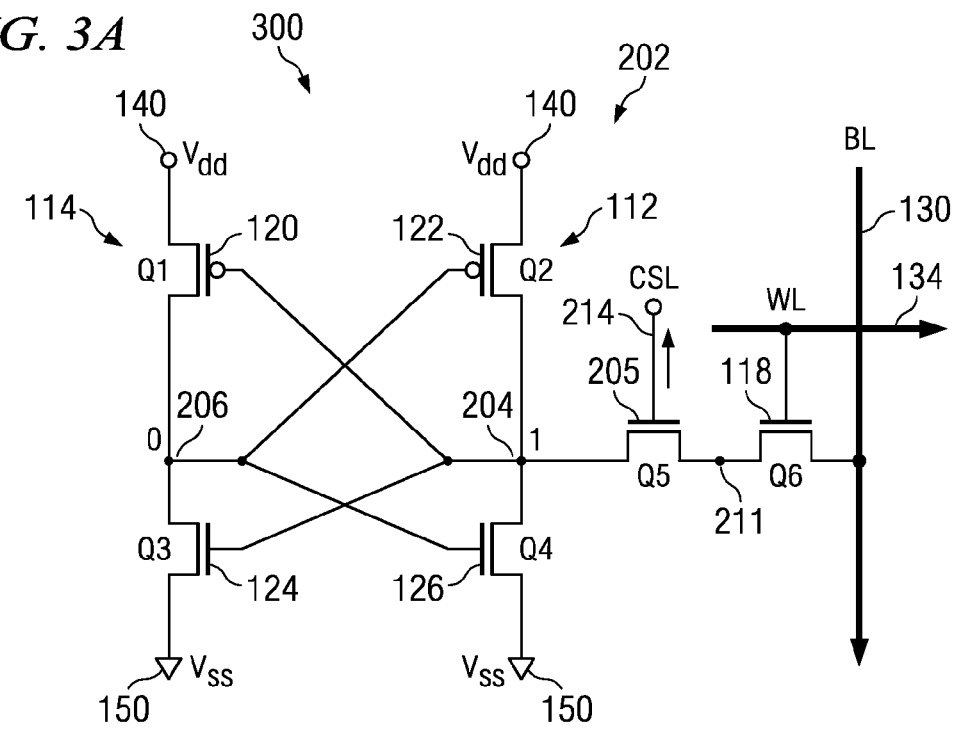
FIGS. 3A and 3B are schematic diagrams of a single-sided 6T SRAM cell such as may be used in accordance with the present invention.
Figure 3B:
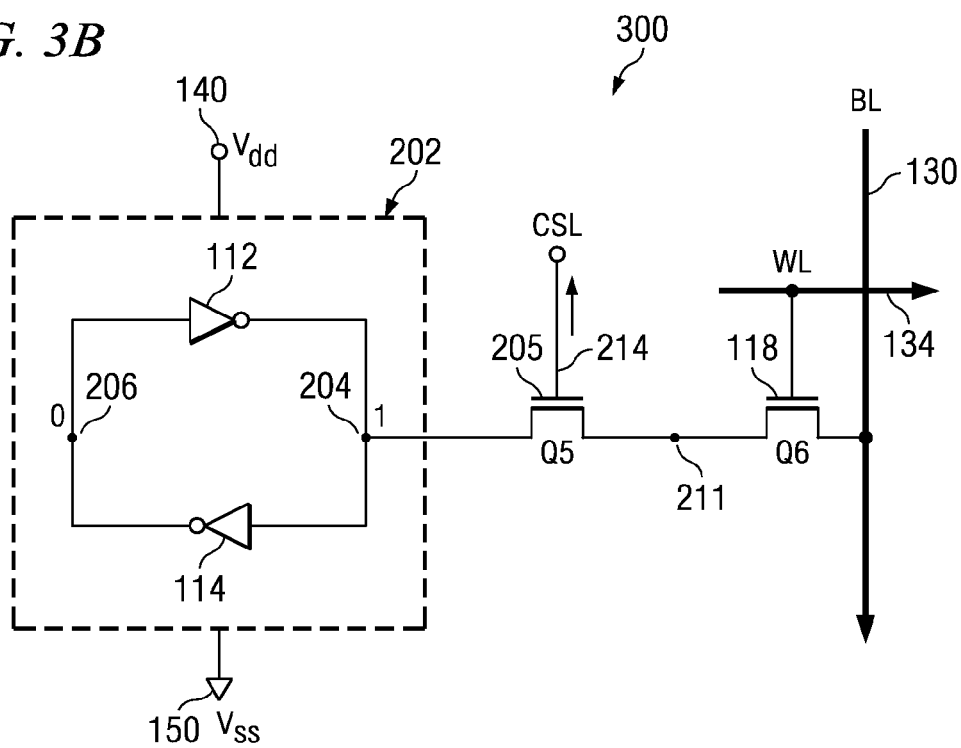

FIGS. 3A and 3B illustrate an exemplary single-ended 6T SRAM cell 300, such as may be used in accordance with the present invention. SRAM cell 300 functions similar to that of the differential 8T SRAM cell 200 of FIGS. 2A and 2B, in the same comparative respects as FIG. 1B relates to that of FIG. 1A, and as such need not be completely described again for the sake of brevity. SRAM cell 300, comprises the latch 202 having cross-coupled first and second inverters 112, and 114, respectively, having outputs connected to first and second latch nodes 204 and 206, respectively. SRAM cell 300 further comprises a first pair of pass gates comprising a first column select pass gate Q5 205 connected to a column select line CSL 214 for selecting a column of cells. Cell 300 further comprises a first word line pass gate Q6 118 connected to a word line WL 134 for selecting a row of cells, the first pair of pass gates (205 and 118) connected in series between the first output 204 of the first inverter 112 and a first bitline BL 130.

As with the differential 8T SRAM cell 200 FIGS. 2A and 2B, the read and write bias conditions of the single-sided 6T SRAM cell 300 of FIGS. 3A and 3B may be adjusted to optimize cell read and write conditions, respectively. Again, the read and write bias conditions comprise, for example, the level of the power supply voltages to drain power supply terminals Vdd 140 and source power supply terminals Vss 150 of the selected memory cell 200, as well as the voltage levels of a write signal on word line WL 134 and a column select signal on column select line CSL 214. In one aspect of the present invention, the read bias condition is different from the write bias condition, wherein one or more of the VDDA array voltage, the VSSA array voltage, the word line voltage, and the column select voltage is different.

For example, in accordance with one aspect of the invention, the read bias condition comprises increasing the array high voltage supply voltage (VDDA) to drain power supply terminals Vdd 140, and/or decreasing the array low voltage supply voltage (VSSA) to source power supply terminals Vss 150 of the selected memory cell 200 during a read operation. In this read bias condition, the overall power supply voltage (e.g., the net, or differential supply voltage)

is greater in the read bias condition than in the write bias condition. This read bias condition has the effect of increasing the read current through the series pass gates and the cell, because the pull-down transistors of the cell conduct more under these bias conditions. The read bias condition also improves the SNM of the cell. However, as indicated previously, it is preferable that the overall or net power supply voltage level remain low across the cell 300 to minimize power dissipation during all operations except for the read operation, which may require more conduction.

Optionally, during the read operation, the overall array supply voltage is increased only in the column(s) of the addressed or selected cell(s). Particularly, in the case of the single-sided 6T SRAM cell 300, the above enhancements for the write operation enable the use of a smaller cell compared to the double-sided 8T SRAM cell 200 of FIGS. 2A and 2B.

Again in another option, and as in the write operation, for improved read current conduction to the latch 202 during a read operation, the column select signal, and/or the write signal to the selected cell(s) may be boosted above the Vdd supply voltage level, as will be discussed further in connection with FIGS. 5D–5F, and 5K infra. Thus, once again, the read or write bias condition on cell 300 may comprise a power supply bias component (VDDA, VSSA) as well as a word line WL 134 and a column select line CSL 214 bias component.

Figure 4A:
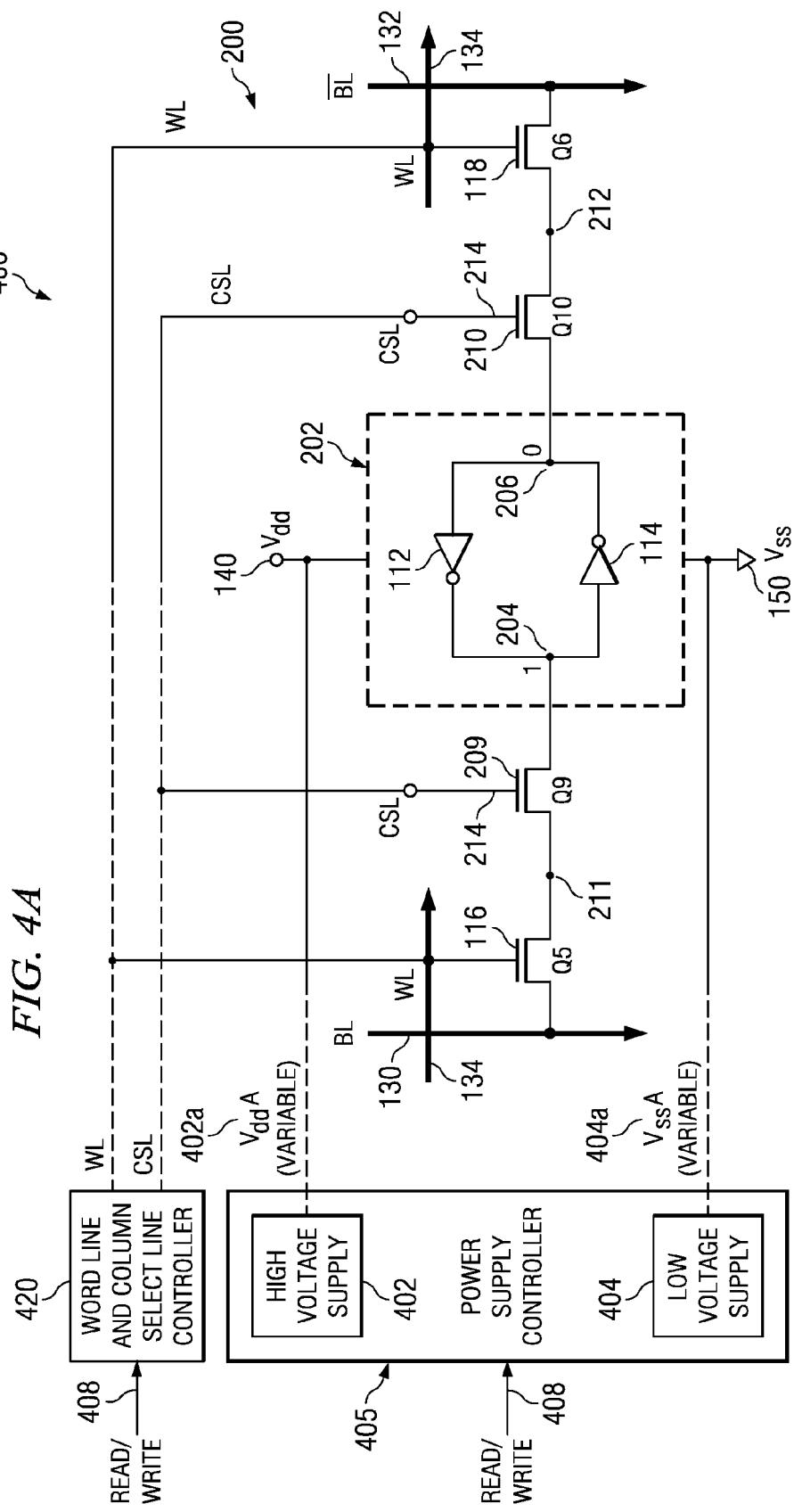
FIG. 4A is a simplified block diagram of an SRAM memory array applied to the SRAM memory cell of FIGS. 2A and 2B, in accordance with several aspects of the present invention.
Figure 4B:
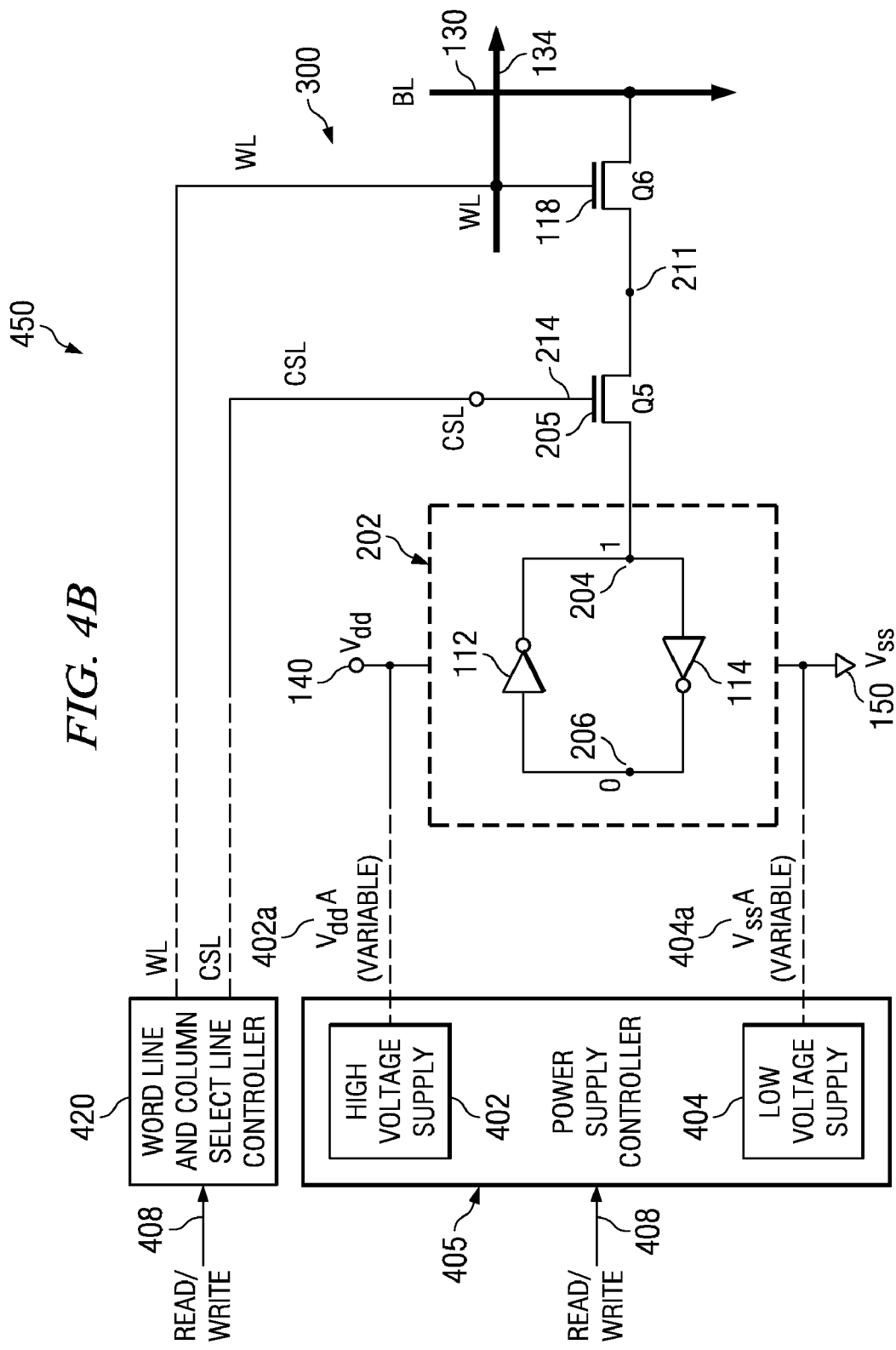
FIG. 4B is a simplified block diagram of an SRAM memory array applied to the SRAM memory cell of FIGS. 3A and 3B, in accordance with several aspects of the present invention.

FIGS. 4A and 4B illustrate an exemplary SRAM memory array 400 and 450, respectively, such as may be applied to the SRAM memory cell 200 of FIGS. 2A and 2B SRAM and memory cell 300 of FIGS. 3A and 3B, respectively, in accordance with several aspects of the present invention. SRAM memory array 400 and 450, for example, comprises a plurality of differential 8T SRAM cells 200, and a plurality of single-sided 6T SRAM memory cells 300, respectively.

The SRAM memory arrays 400 and 450, both further comprise a high voltage supply 402 and a low voltage supply 404 to provide each array with a variable high voltage VDDA 402a and a variable low voltage VSSA 404a, as directed by a read input 408 and a write input 410. These voltages comprise a power supply bias component (VDDA, VSSA) of the read and write bias conditions used in the read and write operations, respectively. Optionally, these supply voltages in combination with a word line WL 134 voltage/signal and/or a column select line CSL 214 voltage/signal from an optional WL and CSL controller 420, supply a read bias condition for a read operation and a write bias condition for a write operation of the array 400, 450.

FIG. 4A, for example, illustrates an exemplary SRAM memory array 400 such as may be applied to the SRAM memory cell 200 of FIGS. 2A and 2B, in accordance with several aspects of the present invention. SRAM memory array 400 comprises a plurality of cells 200, a high voltage supply 402, and a low voltage supply 404, the high and low voltage supplies operable to provide a variable array high voltage VDDA 402a and a variable array low voltage VSSA 404a, respectively, to the high and low voltage terminals, Vdd 140 and Vss 150, respectively, of memory cells 200 of the array 400. The variable high and low voltage supplies 402 and 404, respectively, and/or together with a word line signal on word line WL 134 and/or with a column select signal on column select line CSL 214, are further operable to supply a read bias condition for a read operation and a write bias condition for a write operation of the array 400, wherein the read and write bias conditions are different.

Indications of the read and write operation, for example, may be supplied by a high and low state on a read/write input 408 to each of the variable high and low voltage supplies 402 and 404, respectively. The read and write bias conditions produced by array 400 for the plurality of cells 200, are operable to provide optimal reading and writing conditions, and improved SNM, read current, and Vtrip, while avoiding data upsets of the unaddressed cells (not shown) along an accessed word line 134. Optionally, the variable high and low voltage supplies 402 and 404, respectively, may be united within or replaced by a single power supply controller 405, having the read/write input 408, and operable to provide variable supply array voltages VDDA 402a and VSSA 404a, respectively.

Optionally, array 400 further comprises a word line and a column select line driver or controller 420 operable to drive the word line WL 134, and the column select line CSL 214, respectively, in response to read and write operation indications from read/write input 408. In a further option, controller 420 is operable to vary (e.g., boost or reduce) the voltage(s) on the word line 134 and the column select line 214. The word line and column select line driver, and the high and low voltage supplies (402 and 404), or together with the power supply controller 405, are operable to supply a write bias condition to the array 400 during a write operation, and a read bias condition to the array during a read operation, wherein the write bias condition is different from the read bias condition.

For example, the VDDA output of the array high voltage supply 402 may provide a nominal Vdd, a reduced or lower level Vdd−, an increased or higher level Vdd+, or another such VDDA level. Similarly, the VSSA output of the array low voltage supply 404 may provide, for example, a nominal Vss, a reduced or lower level Vss−, an increased or higher level Vss+, or another such VSSA level. The combination of the variable outputs from the array high voltage supply 402 and the array low voltage supply 404, produce either the read bias condition or the write bias condition. The read or write bias conditions may be further optimized by combining the variable outputs from the array high voltage supply 402 and/or the array low voltage supply 404, together with a varied voltage level (e.g., boosted or reduced voltage) on the word line WL 134 and/or the column select line CSL 214.

The inventors of the present invention have appreciated that varying any one, or all four of these voltage levels, may be used to provide the optimal difference that is desired between the read and write bias conditions.

During a read operation, and in accordance with one implementation of the invention, the array high voltage supply 402 is instructed by the read/write operation input 408 to supply an increased VDD+ voltage to the drain supply terminal Vdd 140 for the entire array 400 of cells 200, or only to the column(s) of cells associated with the selected cell(s) 200 of array 400. Further, the array low voltage supply 404 may be instructed by the read/write operation input 408 to supply a decreased VSSA− voltage to the source supply terminal Vss 150 for the entire array 400 of cells 200, or only to the column(s) of cells associated with the selected cell(s) 200 of array 400. The raising and lowering of the VSSA voltage may be done independent of a lowering and raising of the VDDA voltage.

Similarly, during a write operation, for example, the array high voltage supply 402 may be instructed by the read/write operation input 408 to supply a decreased VDDA− voltage to the drain supply terminal Vdd 140 for the entire array 400 of cells 200, or only to the column(s) of cells associated with the selected cell(s) 200 of array 400. Further, the array low voltage supply 404 may be instructed by the read/write operation input 408 to supply an increased VSS+ voltage to the source supply terminal Vss 150 for the entire array 400 of cells 200, or only to the column(s) of cells associated with the selected cell(s) 200 of array 400.

Although a differential 8T SRAM cell (e.g. cell 200) is illustrated and described in the context of the array 400 of FIG. 4A having the array high and low voltage power supplies 402 and 404, respectively, therein, it is appreciated that a single-sided 6T cell (e.g., cell 300) may also be utilized to operate similarly in the array with the read and write bias conditions provided by the adjustable array voltage supplies 402 and 404, for example.

FIG. 4B, for example, illustrates an exemplary SRAM memory array 450 such as may be applied to the SRAM memory cell 300 of FIGS. 3A and 3B, in accordance with several aspects of the present invention. SRAM memory array 450 comprises a plurality of cells 300, a high voltage supply 402, and a low voltage supply 404, the high and low voltage supplies operable to provide a variable array high voltage VDDA 402a and a variable array low voltage VSSA 404a, respectively, to the high and low voltage terminals, Vdd 140 and Vss 150, respectively, of memory cells 300 of the array 450. The variable high and low voltage supplies 402 and 404, respectively, and/or together with a word line signal on word line WL 134 and/or with a column select signal on column select line CSL 214, are further operable to supply a read bias condition for a read operation and a write bias condition for a write operation of the array 450, wherein the read and write bias conditions are different.

Indications of the read and write operation, for example, may be supplied by a read/write input 408 to each of the variable high and low voltage supplies 402 and 404, respectively. The read and write bias conditions produced by array 450 for the plurality of cells 300, are operable to provide optimal reading and writing conditions, and improved SNM, while avoiding data upsets of the unaddressed cells (not shown) along an accessed word line 134. Optionally, the variable high and low voltage supplies 402 and 404, respectively, may be united within or replaced by a single power supply controller 405, having the read/write input 408, and operable to provide variable supply array voltages VDDA 402a and VSSA 404a, respectively.

Optionally, array 450 further comprises a word line and a column select line driver or controller 420 operable to drive the word line WL 134, and the column select line CSL 214, respectively, in response to read/write operation input 408. In a further option, controller 420 is operable to vary (e.g., boost or reduce) the voltage(s) on the word line 134 and the column select line 214. The word line and column select line driver, and the high and low voltage supplies (402 and 404), or together with the power supply controller 405, are operable to supply a write bias condition to the array 450 during a write operation, and a read bias condition to the array during a read operation, wherein the write bias condition is different from the read bias condition.

For example, the VDDA output of the array high voltage supply 402 may provide a nominal Vdd, a reduced or lower level Vdd−, an increased or higher level Vdd+, or another such VDDA level. Similarly, the VSSA output of the array low voltage supply 404 may provide, for example, a nominal Vss, a reduced or lower level Vss−, an increased or higher level Vss+, or another such VSSA level. The combination of the variable outputs from the array high voltage supply 402 and the array low voltage supply 404, produce either the read bias condition or the write bias condition. The read or write bias conditions may be further optimized by combining the variable outputs from the array high voltage supply 402 and/or the array low voltage supply 404, together with a varied voltage level (e.g., boosted or reduced voltage) on the word line WL 134 and/or the column select line CSL 214.

The inventors of the present invention have appreciated that varying any one, or all four of these voltage levels, may be used to provide the optimal difference that is desired between the read and write bias conditions.

During a read operation, and in accordance with one implementation of the invention, the array high voltage supply 402 is instructed by the read/write operation input 408 to supply an increased VDD+ voltage to the drain supply terminal Vdd 140 for the entire array 450 of cells 300, or only to the column(s) of cells associated with the selected cell(s) 300 of array 450. Further, the array low voltage supply 404 may be instructed by the read/write operation input 408 to supply a decreased VSSA− voltage to the source supply terminal Vss 150 for the entire array 450 of cells 300, or only to the column(s) of cells associated with the selected cell(s) 300 of array 450.

Similarly, during a write operation, for example, the array high voltage supply 402 may be instructed by the read/write operation input 408 to supply a decreased VDDA− voltage to the drain supply terminal Vdd 140 for the entire array 450 of cells 300, or only to the column(s) of cells associated with the selected cell(s) 300 of array 450. Further, the array low voltage supply 404 may be instructed by the read/write operation input 408 to supply an increased VSS+ voltage to the source supply terminal Vss 150 for the entire array 450 of cells 300, or only to the column(s) of cells associated with the selected cell(s) 300 of array 450.

FIGS. 5A–5C illustrate the impacts of a word line voltage (VWL), an array source supply voltage (VSSA), and an array drain supply voltage (VddA) on trip voltage (Vtrip) and static noise margin (SNM) in a conventional differential 6T SRAM cell such as cell 100 of FIG. 1A. In FIGS. 5A–5C, the y-axis is in units of volts, while the x-axis is in units of volts applied to a word line, or to a supply line of the cell. The data presented utilizes nominal models at room temperature, having pre-charged bitlines and an array nwell at 1.2 volts, and 0 volts on the substrate. Further, to access the latch 102 (or bit) within the conventional 6T SRAM cell, the word line pass gates (e.g., 116, 118) must be enabled, to obtain the data plotted herein.

FIG. 5A, for example, illustrates a graph 501 of trip voltage (Vtrip) and static noise margin (SNM) voltage values plotted as a function of a word line voltage (VWL) of the conventional differential 6T SRAM cell 100 of FIG. 1A. FIGS. 5B and 5C illustrate graphs 502 and 503, respectively, of trip voltage (Vtrip) and static noise margin (SNM) voltage values plotted as a function of VssA and VddA array supply voltages, respectively, of the conventional differential 6T SRAM cell 100 of FIG. 1A.

FIGS. 5A–5C further illustrate that the conventional 6T SRAM cell operation suffers from the Vtrip vs. SNM dilemma or compromise previously discussed. In particular, as Vtrip is improved by boosting the WL voltage, by raising VSSA, or by lowering VDDA, SNM is proportionally degraded.

Figure 6A:
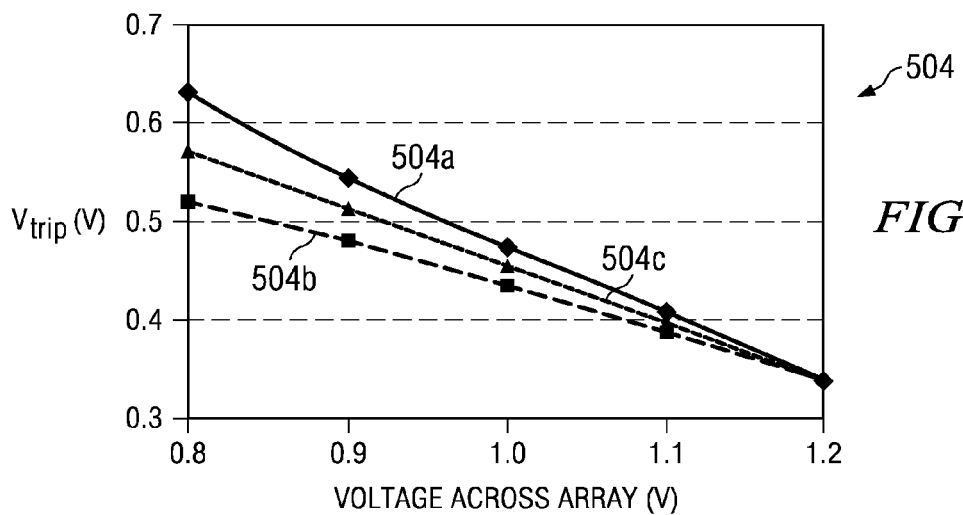
FIGS. 6A–6C are graphs of the impact of VddA and VssA array supply voltages on trip voltage (Vtrip), static noise margin (SNM), and read current (Iread) in an 8T SRAM cell used in accordance with several aspects of the present invention.
Figure 6B:
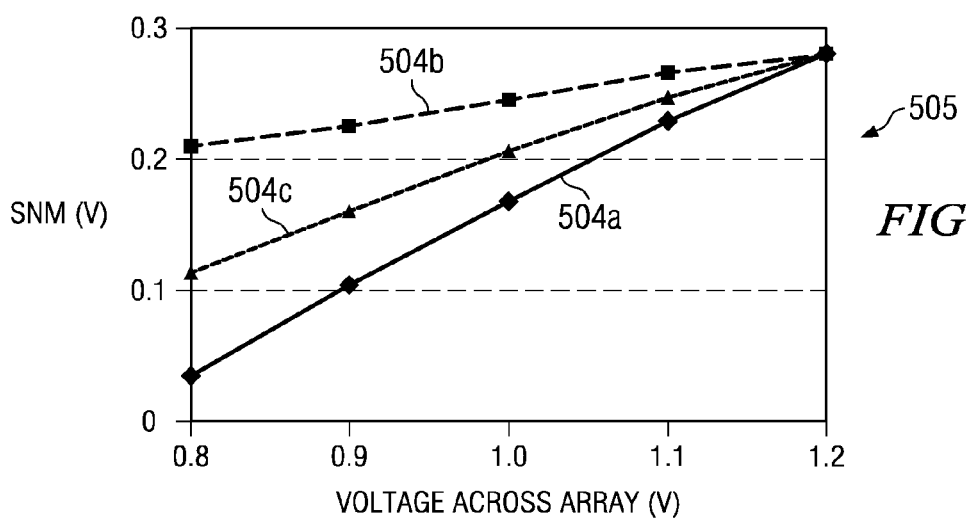
Figure 6C:
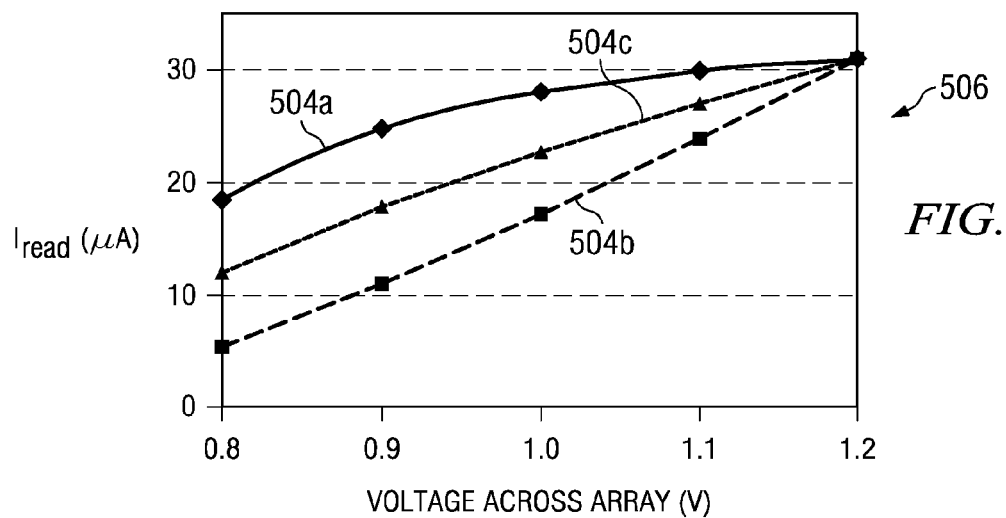

FIGS. 6A–6C illustrate graphs of the impact of VddA and VssA array supply voltages on trip voltage (Vtrip), static noise margin (SNM), and read current (Iread) in an 8T SRAM cell, similar to cell 200 of FIGS. 2A and 2B, used in an array similar to array 400 of FIG. 4A, having variable high and low voltage supplies used in accordance with several aspects of the present invention. Graphs 504, 505, and 506 of FIGS. 6A, 6B, and 6C, respectively, further illustrate the results of lowering VDDA only 504a, of raising VSSA only 504b, and of lowering VDDA and raising VSSA equally 504c to the 8TSRAM cell. Again, to access the latch 202 (or bit) within the differential 8T SRAM cell (or a single-sided 6T SRAM cell) the WL and CSL pass gates are enabled (e.g., raised to a high state) in the selected cell or cells, to obtain the data plotted herein.

FIGS. 6A–6C demonstrate that when both WL and CSL lines are high (e.g., 1.2 volts), and when VDDA is lowered or VSSA is raised, the Vtrip of the 8T SRAM cell is improved, while the SNM and Iread are degraded, similar to the results of the conventional 6T cell. However, in actual memory operations, the CSL line (e.g., 214) will deselect all the unaddressed cells on the active row during a read or write operation. Therefore, using the 8T SRAM cell in the array of the present invention, similar to array 400 of FIG. 4A, yields: an improved Vtrip by writing at a lowered VDDA or a raised VSSA (as shown toward the left side of FIG. 6A) without degrading SNM in the unaddressed columns; a good SNM and Iread by reading at normal VDDA and VSSA (as shown at the right side of FIGS. 6B and 6C) in the addressed columns during a read operation.

Further, power consumption can be reduced in the array of the present invention (e.g., using the 8T SRAM cells), by keeping the voltage across the array low during STANDBY and write operations for all columns, and raising the voltage across the array (e.g., to the periphery Vdd of 1.2V) during a read operation, and preferably only on the addressed cells, columns, or row.

Figure 6D:
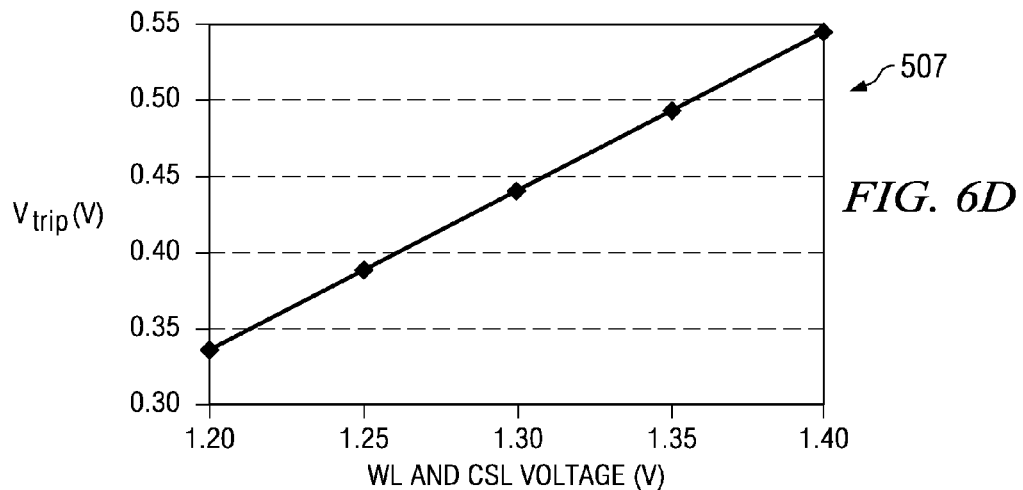
FIGS. 6D–6F are graphs of the impact of word line (WL) and column select line (CSL) voltages on trip voltage (Vtrip), static noise margin (SNM), and read current (Iread) in an 8T SRAM cell, without varying one or more of the supply voltages.
Figure 6E:
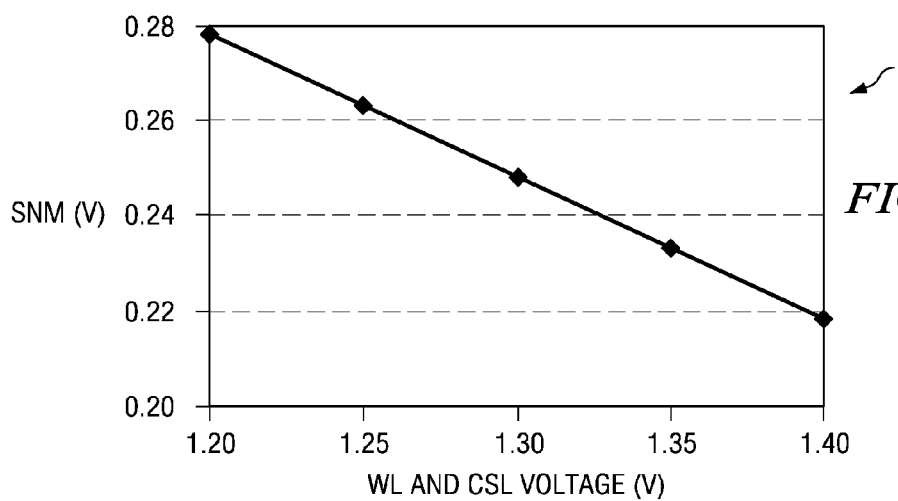
Figure 6F:
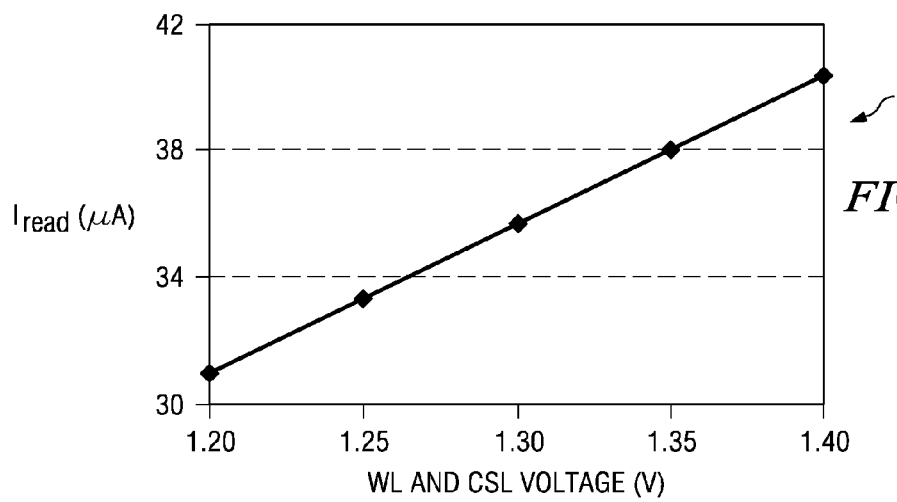

FIGS. 6D–6F illustrate graphs of the impact of word line (WL) and column select line (CSL) voltages on trip voltage (Vtrip) in graph 507 of FIG. 6D, static noise margin (SNM) in graph 508 of FIG. 6E, and read current (Iread) in graph 509 of FIG. 6F, respectively, in an 8T SRAM cell used in a prior art array and method, wherein only the word line and the column select line are varied.

Graphs 507, 508, and 509 of FIGS. 6D, 6E, and 6F, respectively, demonstrate that in the prior art 8T SRAM memory cell operation of boosting CSL and WL voltages alone improves Vtrip 507 and Iread 509, but degrades SNM 508. Thus, boosting CSL and WL alone may not be adequate for a read operation. However, if the CSL and/or the WL is boosted together with an adjustment of the voltage across the array of cells, the Vtrip, SNM, and Iread trade-offs may be optimized.

Figure 7A:
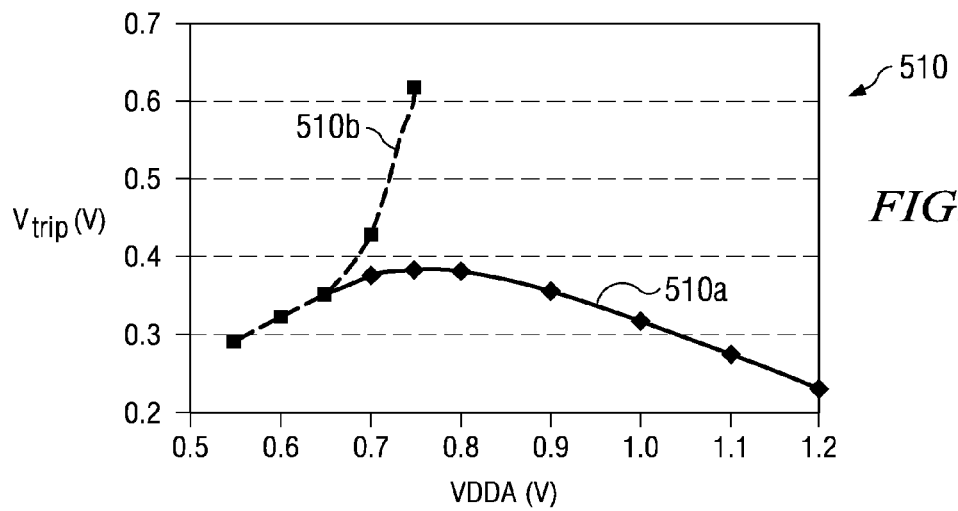
FIGS. 7A–7C are graphs of the impact of VddA array supply voltage on trip voltage (Vtrip), static noise margin (SNM), and read current (Iread) in an SS 6T SRAM cell used in accordance with several aspects of the present invention.
Figure 7B:
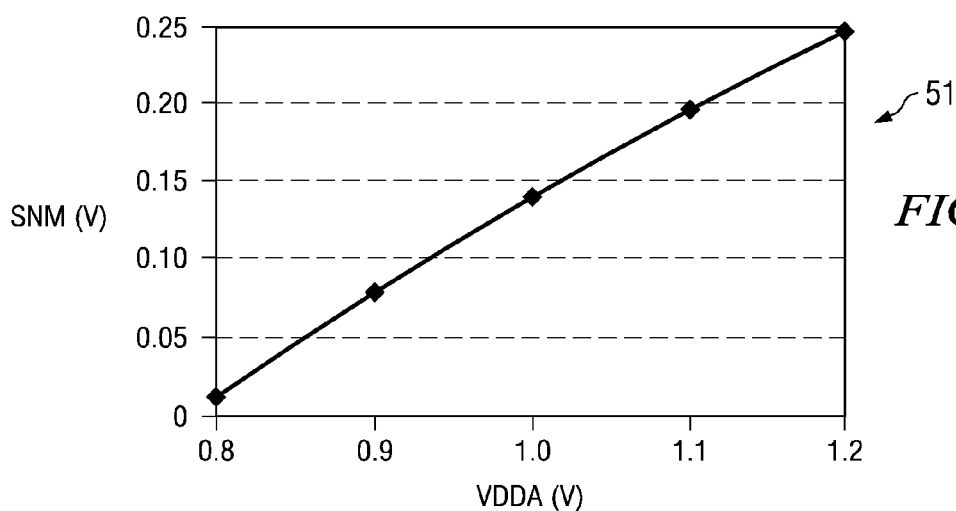
Figure 7C:
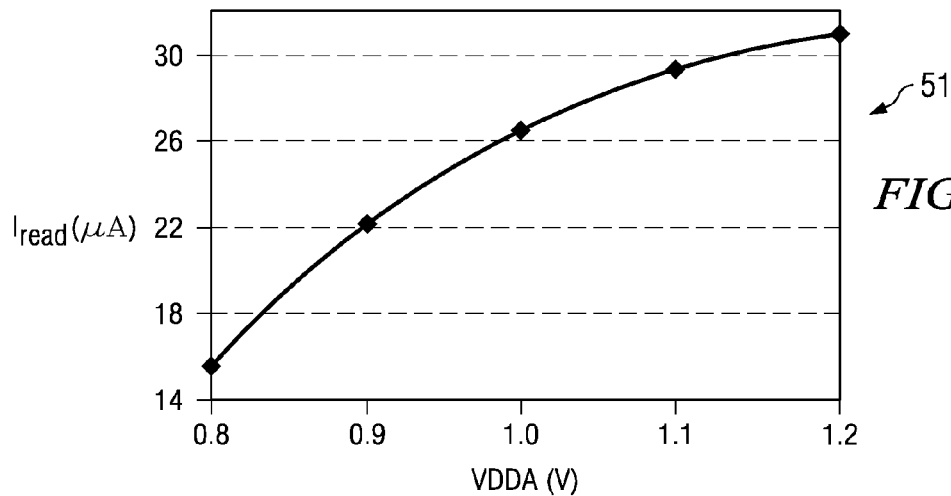

FIGS. 7A–7C illustrate graphs of the impact of VddA array supply voltage on trip voltage (Vtrip) in graph 510 of FIG. 7A, static noise margin (SNM) in graph 511 of FIG. 7B, and read current (Iread) in graph 512 of FIG. 7C, in an SS 6T SRAM cell used in accordance with several aspects of the present invention.

Graph 510 of FIG. 7A further illustrates that for the single-sided 6T cell, when CSL and WL are both high (e.g., 1.2V), and VDDA is lowered to about 0.75 volts, that Vtrip is improved both for writing a "0" in plot 510a and for writing a "1" in plot 510b. Note that in graph 510 of FIG. 7A, when VDDA is greater than 0.75 volts, for example, the Vtrip for writing a "1" at 510b is off the chart on the high side. Under these same conditions (e.g., CSL and WL high, and VDDA lowered), SNM 511 of FIG. 7B and Iread 512 of FIG. 7C are degraded similar to a standard 5T SRAM cell (e.g., 160 of FIG. 1B).

In actual operations of the single sided 6T CRAM cell, however, CSL will deselect all the unaddressed cells on the active row during a read or write operation. Thus, using the single-sided 6T SRAM cell in the array of the present invention, similar to array 450 of FIG. 4B, yields: an improve Vtrip by performing a write operation at a lowered VDDA (e.g., down to around an optimal voltage), or raising VSSA (e.g., toward the left side of FIG. 10, less than or equal to about 0.75 volts) without degrading the SNM of the cells in unaddressed columns. The SS 6T SRAM cell in the array of the present invention further provides an adequate SNM and Iread by reading at a nominal VDDA and VSSA, for example, as shown at the right of graph 511 of FIG. 7B and graph 512 of FIG. 7C.

Similar to the 8T cell, power consumption can be reduced in the array of the present invention (e.g., using the SS 6T SRAM cells), by keeping the voltage across the array low during STANDBY and write operations for all columns, and raising the voltage across the array (e.g., to the periphery Vdd of 1.2V) during a read operation, and preferably only on the addressed cells, columns, or row.

Figure 7D:
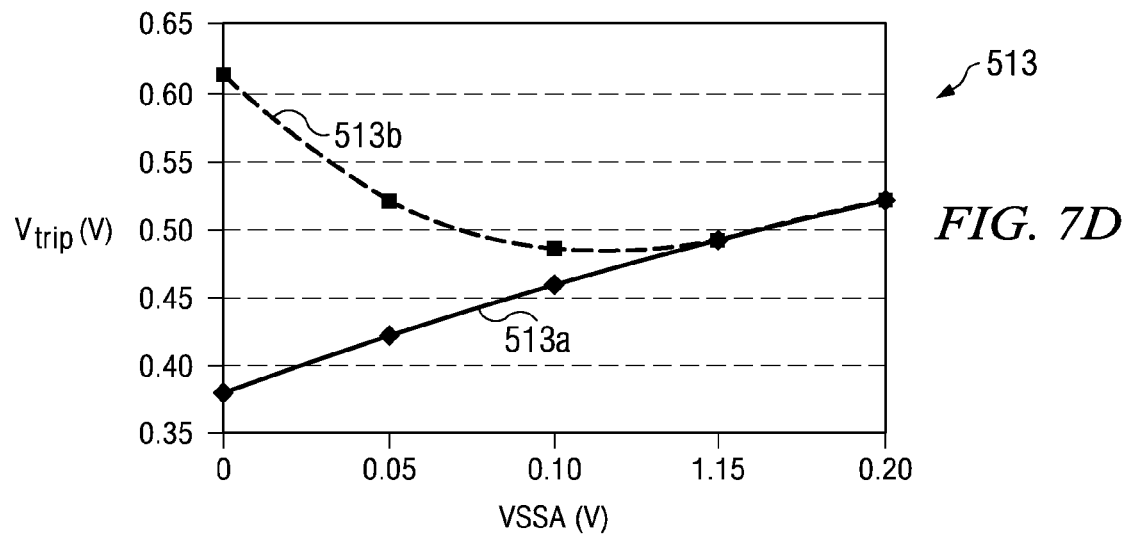
FIGS. 7D and 7E are graphs of the impact of lowering VddA and raising VssA array supply voltages, or boosting the word line (WL) and the column select line (CSL) voltages to further improve the trip voltage (Vtrip) in a SS 6T SRAM cell used in accordance with several aspects of the present invention.
Figure 7E:
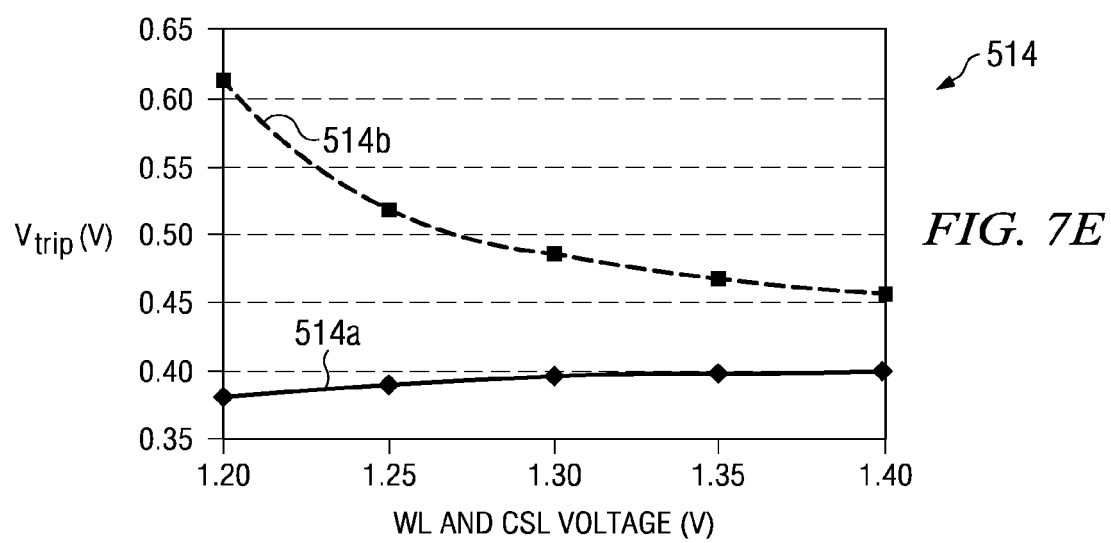

FIGS. 7D and 7E illustrate graphs 513 and 514, respectively, of the impact of lowering VddA and raising VssA array supply voltages, or boosting the word line (WL) and the column select line (CSL) voltages to further improve the trip voltage (Vtrip) in a SS 6T SRAM cell used in accordance with several aspects of the present invention.

For example, graphs 513 and 514 are both shown with VDDA lowered to an exemplary about 0.75 volts. Graph 513 of FIG. 7D illustrates that with the VDDA lowered to about 0.75 volts, that Vtrip is improved both for writing a "0" in plot 513a and for writing a "1" in plot 513b for a VSSA increase of up to about 0.12 volts, for example. Graph 514 of FIG. 7E illustrates that with the VDDA lowered to about 0.75 volts, that Vtrip is improved both for writing a "0" in plot 514a and for writing a "1" in plot 514b for a WL and a CSL increase of up to about 1.4 volts, for example.

In another aspect of the present invention, a method is described for operating an SRAM memory cell (e.g., a differential 8T SRAM cell 200 of FIGS. 2A and 2B, or a single-sided 6T SRAM cell 300 of FIGS. 3A and 3B) of an array (e.g., array 400 of FIG. 4A, or array 450 of FIG. 4B) having a plurality of SRAM memory cells arranged in a plurality of rows and columns, the array 400, 450 also having a plurality of word lines (e.g., WL 134) for accessing rows of cells and a plurality of column select lines (e.g., CSL 214) and bit lines (e.g., BL 130, BL-bar 132) for accessing columns of cells (200, 300). The memory cells of the array comprise first and second cross-coupled inverters (112, 114) having first and second outputs (204, 206), respectively, a column select pass gate 209 connected to the column select lines CSL 214 for selecting a column of cells (200, 300), and a row select pass gate 116 connected to the word lines WL 134 for selecting a row of cells, the pass gates (116 and 209) connected in series between the first output 204 of the first inverter 112 and a first of the plurality of bit lines BL 130.

The array further comprises a high voltage supply 402 to provide a high voltage (e.g., VDDA 402a) to a high voltage terminal Vdd 140 of the array 400, 450 and a low voltage supply 404 to provide a low voltage (e.g., VSSA 404a) to the low voltage terminal Vss 150 of the array 400, 450. The array also comprises a word line driver 420 operable to drive the word line 134 and a column select line driver 420 operable to drive the column select line 214. The word line driver, the column select line driver, and the high and low voltage supplies are operable to supply a write bias condition to the array during a write operation, and a read bias condition to the array during a read operation, and wherein the write bias condition is different from the read bias condition.

The method comprises establishing a read bias condition during a read operation by raising the voltage of the high voltage supply to the selected columns of cells, and lowering the voltage of the low voltage supply to the selected columns of cells.

The method also comprises establishing a write bias condition during a write operation by lowering the voltage of the high voltage supply to the selected columns of cells, and/or raising the voltage of the low voltage supply to the selected columns of cells. The read bias condition also improves the SNM of the cell.

The method also comprises accessing a word line of the SRAM memory cell by asserting a word line signal to the row select line associated with the memory cell during the read or the write operation.

The method further comprises accessing a column select line of the SRAM memory cell by asserting a column select signal to the column select line associated with the memory cell during the read or the write operation such that one of the plurality of cells of the array is accessed.

The SRAM array structure and method provides optimum static noise margin, while minimizing data upsets and power dissipation during read and write operations, by allowing the array supply voltage to be kept low during all but the read operation and then, enabled by a column select, only raising the supply to the selected columns for increased read current.

Although an SRAM cell has been discussed in accordance with the arrays and method of the present invention, it is appreciated by the inventor that other such cell and transistor technology variations, including array, bitline, or wordline orientation variations are anticipated in the context of the present invention.

The invention is also not limited to the use of silicon wafers, and may be implemented in association with the manufacture of various semiconductor devices, SRAM memory devices, or other such devices, wherein the design and optimization of an SRAM cell, potential data upsets, and power consumption is an issue, where cell access is to be limited only to the memory area being used, and wherein the various aspects thereof may be applied.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and/or the claims, such terms are intended to be inclusive in a manner similar to the term "comprising."

What is claimed is:

1. A memory array having a plurality of SRAM memory cells arranged in a plurality of rows and columns, the array also having a plurality of word lines for accessing rows of cells and a plurality of column select lines and bit lines for accessing columns of cells, the memory array comprising:

the memory cells comprising first and second cross-coupled inverters having first and second outputs, respectively, a first pair of pass gates comprising a first column select pass gate connected to a first one of the column select lines for selecting a column of cells, and a first row select pass gate connected to a first one of the word lines for selecting a row of cells, the first pair of pass gates connected in series between the first output of the first inverter and a first of the plurality of bit lines;

a high voltage supply operable to provide a variable high voltage to a high voltage supply terminal of the cross-coupled inverters; and a low voltage supply operable to provide a variable low voltage to a low voltage supply terminal of the cross-coupled inverters;

wherein the high and low voltage supplies are operable to supply a write bias condition to the cross-coupled inverters during a write operation and a read bias condition to the cross-coupled inverters during a read operation, and wherein the write bias condition is different from the read bias condition.

2. The memory array of claim 1, further comprising:
a word line driver operable to drive the word line; and
a column select line driver operable to drive the column select line;
wherein the word line driver, the column select line driver, and the high and low voltage supplies are operable to supply a write bias condition to the cross-coupled inverters during a write operation and a read bias condition to the cross-coupled inverters during a read operation, and wherein the write bias condition is different from the read bias condition.

3. The memory array of claim 2, wherein the word line driver is operable to drive the word line to a higher voltage during the write operation than during the read operation.

4. The memory array of claim 2, wherein the column select line driver is operable to drive the column select line to a higher voltage during the write operation than during the read operation.

5. The memory array of claim 1, wherein the high voltage provided by the high voltage supply is higher during the read operation than the voltage is during the write operation.

6. The memory array of claim 1, wherein the high voltage provided by the high voltage supply is raised during the read operation.

7. The memory array of claim 6, wherein the high voltage provided by the high voltage supply is raised in selected columns during the read operation.

8. The memory array of claim 1, wherein the high voltage provided by the high voltage supply is lowered during the write operation.

9. The memory array of claim 1, wherein the low voltage provided by the low voltage supply is higher during the write operation than during the read operation.

10. The memory array of claim 1, wherein the low voltage provided by the low voltage supply is raised during the write operation.

11. The memory array of claim 1, wherein the low voltage provided by the low voltage supply is lowered during the read operation.

12. The memory array of claim 11, wherein the low voltage provided by the low voltage supply is lowered in selected columns of cells during the read operation.

13. The memory array of claim 1, wherein the plurality of memory cells further comprises a second pair of pass gates comprising a second row pass gate and a second column select pass gate connected in series between the second output of the second inverter and a second of the plurality of bit lines, the second column select pass gate connected to the first one of the column select lines for selecting a column of cells, and the second row select pass gate connected to the first one of the word lines for selecting a row of cells, the second pair of pass gates connected in series between the second output of the second inverter and a second of the plurality of bit lines.

14. The memory array of claim 1, wherein the high voltage provided by the high voltage supply is raised in selected columns of cells, and the low voltage provided by the low voltage supply is lowered in selected columns of cells during the read operation.

15. The memory array of claim 1, wherein the high voltage provided by the high voltage supply is lowered in selected columns of cells, and the low voltage provided by the low voltage supply is raised in selected columns of cells during the write operation.

16. The memory array of claim 1, wherein the high and low voltage power supplies are further operable to supply to the selected column of cells of the array, a write bias condition during a write operation and a read bias condition during a read operation.

17. A memory array having a plurality of SRAM memory cells arranged in a plurality of rows and columns, the array also having a plurality of word lines for accessing rows of cells and a plurality of column select lines and bit lines for accessing columns of cells, the memory array comprising:
the memory cells comprising first and second cross-coupled inverters having first and second outputs, respectively, a column select pass gate connected to the column select lines for selecting a column of cells, and a row select pass gate connected to the word lines for selecting a row of cells, the pass gates connected in series between the first output of the first inverter and a first of the plurality of bit lines;
a high voltage supply to provide a high voltage to a high voltage supply terminal of the cross-coupled inverters;
a low voltage supply to provide a low voltage to a low voltage supply terminal of the cross-coupled inverters;
a word line driver operable to drive the word line; and
a column select line driver operable to drive the column select line;
wherein the word line driver, the column select line driver, and the high and low voltage supplies are operable to supply a write bias condition to the cross-coupled inverters during a write operation and a read bias condition to the cross-coupled inverters during a read operation, and wherein the write bias condition is different from the read bias condition.

18. The memory array of claim 17, wherein the word line driver is operable to drive the word line to a higher voltage during the write operation than the voltage is during the read operation.

19. The memory array of claim 17, wherein the plurality of memory cells further comprise row and column select pass gates connected in series between the second output of the second inverter and a second of the plurality of bit lines.

20. The memory array of claim 17, wherein the high voltage provided by the high voltage supply is raised in selected columns of cells, and the low voltage provided by the low voltage supply is lowered in selected columns of cells during the read operation.

21. The memory array of claim 17, wherein the high voltage provided by the high voltage supply is lowered in selected columns of cells, and the low voltage provided by the low voltage supply is raised in selected columns of cells during the write operation.

22. The memory array of claim 17, wherein the high and low voltage power supplies are further operable to supply to the selected column of cells of the array, a write bias condition during a write operation and a read bias condition during a read operation.

23. A method of operating an SRAM memory cell of an array having a plurality of SRAM memory cells arranged in a plurality of rows and columns, the array also having a plurality of word lines for accessing rows of cells and a plurality of column select lines and bit lines for accessing columns of cells, the memory cells comprising first and second cross-coupled inverters having first and second outputs, respectively, a column select pass gate connected to the column select lines for selecting a column of cells, and a row select pass gate connected to the word lines for selecting a row of cells, the pass gates connected in series between the first output of the first inverter and a first of the plurality of bit lines; a high voltage supply to provide a high voltage to a high voltage terminal of the cross-coupled inverters; a low voltage supply to provide a low voltage to the low voltage terminal of the cross-coupled inverters; a word line driver operable to drive the word line; and a column select line driver operable to drive the column select line; wherein the word line driver, the column select line driver, and the high and low voltage supplies are operable to supply a write bias condition to the cross-coupled inverters during a write operation and a read bias condition to the cross-coupled inverters during a read operation, and wherein the write bias condition is different from the read bias condition, the method comprising:
establishing a read bias condition during a read operation by adjusting one or more of the voltages of the high and low voltage supplies to the selected columns of cells;
establishing a write bias condition during a write operation by adjusting one or more of the voltages of the high and low voltage supplies to the selected columns of cells;
accessing a word line of the SRAM memory cell by asserting a word line signal to the row select line associated with the memory cell during the read or the write operation; and
accessing a column select line of the SRAM memory cell by asserting a column select signal to the column select line associated with the memory cell during the read or the write operation such that one of the plurality of cells of the array is accessed.

24. The method of claim 23, wherein the high voltage provided by the high voltage supply is higher during the read operation than the voltage is during the write operation.

25. The method of claim 23, wherein the establishing of the read bias condition during the read operation comprises raising the voltage of the high voltage supply to the selected columns of cells, and lowering the voltage of the low voltage supply to the selected columns of cells.

26. The method of claim 23, wherein the establishing of the write bias condition during a write operation comprises lowering the voltage of the high voltage supply to the selected columns of cells, and raising the voltage of the low voltage supply to the selected columns of cells.

* * * * *